United States Patent
Li et al.

(10) Patent No.: US 10,930,214 B2
(45) Date of Patent: Feb. 23, 2021

(54) PIXEL CIRCUIT DRIVING METHOD, PIXEL CIRCUIT GROUP AND ORGANIC LIGHT EMITTING DISPLAY DEVICE IMPROVING DISPLAY APERTURE RATIO AND RESOLUTION

(71) Applicant: SHENZHEN ROYOLE TECHNOLOGIES CO. LTD., Shenzhen (CN)

(72) Inventors: Wenhui Li, Shenzhen (CN); Ze Yuan, Shenzhen (CN)

(73) Assignee: SHENZHEN ROYOLE TECHNOLOGIES CO. LTD., Shenzhen (CN)

( * ) Notice: Subject to any disclaimer, the term of this patent is extended or adjusted under 35 U.S.C. 154(b) by 0 days.

(21) Appl. No.: 16/442,935

(22) Filed: Jun. 17, 2019

(65) Prior Publication Data
US 2019/0304369 A1     Oct. 3, 2019

Related U.S. Application Data

(63) Continuation of application No. PCT/CN2016/112344, filed on Dec. 27, 2016.

(51) Int. Cl.
*G09G 3/3241*     (2016.01)
*H01L 27/32*     (2006.01)
(Continued)

(52) U.S. Cl.
CPC ......... *G09G 3/3241* (2013.01); *G09G 3/3225* (2013.01); *G09G 3/3233* (2013.01);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS 9,728,125 B2 *   8/2017   Li ..................... G09G 3/3233
2005/0225251 A1   10/2005   Hsueh
(Continued)

FOREIGN PATENT DOCUMENTS

CN   101859536 A   10/2010
CN   103680391 A   3/2014
(Continued)

OTHER PUBLICATIONS

International search report dated Oct. 19, 2017 from corresponding application No. PCT/CN2016/112344.

*Primary Examiner* — Alexander Eisen
*Assistant Examiner* — Nelson Lam
(74) *Attorney, Agent, or Firm* — Hauptman Ham, LLP (57) ABSTRACT

A pixel circuit driving method is disclosed. The method including: a plurality of rows of pixel circuits are provided, each row of the pixel circuit includes a switch module, a driving module, a compensation module, an organic light emitting diode, a first scanning line, a second scanning line, and a data compensation line. The switch module is turned on to activate the driving module. The compensation module is turned off to enable a data terminal to output a data signal which is transmitted to the organic light emitting diode. The organic light emitting diode being activated, the compensation module being turned on via the second scanning line, and the switch module being turned off, thus to perform compensation detection on the organic light emitting diode. A compensation signal is outputted and transmitted to the organic light emitting diode for performing compensation after detection.

12 Claims, 5 Drawing Sheets

(51) Int. Cl.
*G09G 3/36* (2006.01)
*G09G 3/3233* (2016.01)
*G09G 3/3225* (2016.01)

(52) U.S. Cl.
CPC ........... *G09G 3/36* (2013.01); *H01L 27/3244* (2013.01); *G09G 2300/0814* (2013.01); *G09G 2310/0262* (2013.01)

(58) Field of Classification Search
CPC .... G09G 3/3233; G09G 3/3241; G09G 3/325; G09G 3/3258; H01L 1/3225; H01L 1/3244
USPC ...................................................... 345/76–83
See application file for complete search history.

(56) References Cited

U.S. PATENT DOCUMENTS

| | | | |
|---|---|---|---|
| 2008/0231562 A1* | 9/2008 | Kwon | G09G 3/3233 345/77 |
| 2009/0051628 A1* | 2/2009 | Kwon | G09G 3/3233 345/77 |
| 2011/0122119 A1 | 5/2011 | Bae et al. | |
| 2011/0216056 A1* | 9/2011 | Yoo | G09G 3/3233 345/212 |
| 2013/0100173 A1* | 4/2013 | Chaji | G09G 5/10 345/690 |
| 2014/0347253 A1* | 11/2014 | Lee | G09G 3/3233 345/76 |
| 2015/0130859 A1* | 5/2015 | Yang | G09G 3/3233 345/690 |
| 2016/0104422 A1* | 4/2016 | Kishi | G09G 3/006 345/205 |
| 2016/0267844 A1 | 9/2016 | Senda et al. | |
| 2016/0300534 A1 | 10/2016 | Kishi | |
| 2018/0033372 A1* | 2/2018 | Kishi | G09G 3/3258 |

FOREIGN PATENT DOCUMENTS

| | | |
|---|---|---|
| CN | 104778922 A | 7/2015 |
| JP | 2010160386 A | 7/2010 |
| JP | 2011095720 A | 5/2011 |
| JP | 2015102804 A | 6/2015 |
| JP | 2015156002 A | 8/2015 |
| KR | 1020150061565 A | 6/2015 |
| KR | 1020150100997 A | 9/2015 |
| WO | 2016125641 A1 | 8/2016 |

* cited by examiner

PIXEL CIRCUIT DRIVING METHOD, PIXEL CIRCUIT GROUP AND ORGANIC LIGHT EMITTING DISPLAY DEVICE IMPROVING DISPLAY APERTURE RATIO AND RESOLUTION

CROSS-REFERENCE TO RELATED APPLICATION

This application is a continuation of PCT/CN2016/112344, filed on Dec. 27, 2016, the disclosure of which is hereby incorporated by reference in its entirety.

TECHNICAL FIELD

This present disclosure relates to the field of display, and more particularly, a pixel circuit driving method, a pixel circuit group, and an organic light emitting display device.

BACKGROUND

Generally, a pixel circuit of an active organic light emitting display device includes at least two TFTs (Thin Film Transistor) and one capacitor to drive organic light emitting diodes to emit light. Due to differentiated threshold voltages of the TFTs and aging of organic light emitting material, driving current of the organic light emitting diode changes, causing brightness of the organic light emitting diode to be varied, and further resulting in non-uniformity in organic light emitting display. Presently, the industry solves the problem of non-uniformity of the organic light emitting display by providing a compensation circuit, but the compensation circuit includes many components and circuits, thereby causing the pixel effective display aperture ratio and resolution to be decreased.

SUMMARY

Embodiments of the present disclosure disclose a pixel circuit driving method to solve the problem of uneven display of display device and improve the effective display aperture ratio and resolution.

The present disclosure also discloses a pixel circuit group and an organic light emitting display device.

Embodiments of the present disclosure disclose a pixel circuit driving method, including: providing a plurality of rows of pixel circuits, therein, each row of the pixel circuit includes a switch module, a driving module, a compensation module, an organic light emitting diode, a first scanning line, a second scanning line, and a data compensation line, therein the first scanning line is coupled to the switch module, therein the switch module is further coupled to the driving module, therein the switch module is further coupled to the data compensation line, therein the driving module receives a DC voltage and is coupled to the organic light emitting diode, therein the second scanning line is coupled to the compensation module, and the compensation module is further coupled to the driving module and the organic light emitting diode; each of the plurality of rows of pixel circuits shares an identical data compensation line, and the data compensation line is coupled to the data terminal, the compensation terminal, and the detection terminal of a driving chip; turning on the switch module via the first scanning line to activate the driving module while turning off the compensation module via the second scanning line to enable a data terminal to output a data signal, and transmitting the data signal to the organic light emitting diode via the data compensation line, the switch module and the driving module for display; activating the organic light emitting diode, turning on the compensation module via the second scanning line, and turning off the switch module via the first scanning line to perform compensation detection on the organic light emitting diode, when determining compensation is required for driving, outputting a compensation signal via a compensation terminal, and transmitting the compensation signal to the organic light emitting diode via the data compensation line and the compensation module for performing compensation after detection; therein, the plurality of rows of pixel circuits are displayed and compensated row by row.

Therein, the switch module is a first transistor, therein the driving module is a second transistor, and the compensation module is a third transistor; therein the first scanning line is coupled to a gate of the first transistor, therein a drain of the first transistor is coupled to the data compensation line, and the source of the first transistor is coupled to a gate of the second transistor; therein a drain of the second transistor is coupled to a voltage terminal of the driving chip and is configured for receiving the DC voltage; a source of the second transistor is coupled to an anode of the organic light emitting diode, and a cathode of the organic light emitting diode is grounded; therein the second scanning line is coupled to a gate of the third transistor, therein a drain of the third transistor is coupled to the data compensation line, and a source of the third transistor is coupled to an anode of the organic light emitting diode.

Therein, turning on the switch module via the first scanning line to activate the driving module while turning off the compensation module via the second scanning line to enable a data terminal to output a data signal, and transmit the data signal to the organic light emitting diode via the data compensation line, the switch module and the driving module for display, includes: outputting a high level signal via the first scanning line and outputting a low level signal via the second scanning line, thus to cut off the third transistor and turn on the first transistor and the second transistor; the data signal outputted by the data terminal is transmitted to the organic light emitting diode via the data compensation line, the switch module and the driving module for display.

Therein, activating the organic light emitting diode, turning on the compensation module via the second scanning line, and turning off the switch module via the first scanning line to perform compensation detection on the organic light emitting diode, based on a determination that the compensation is required, outputting a compensation signal via the compensation terminal, and transmitting the compensation signal to the organic light emitting diode via the data compensation line and the compensation module for performing compensation after detection includes: outputting a high level signal via the first scanning line to turn on the first transistor and the second transistor to activate the organic light emitting diode; outputting a low level signal via the first scanning line to cut off the first transistor and the second transistor is turned off, outputting a high level signal via the second scanning line to turn on the third transistor; detecting a current of the organic light emitting diode via the data compensation line and the third transistor successively; when determining the compensation is required, outputting the compensation signal via the compensation terminal, and transmitting the compensation signal to the organic light emitting diode via the data compensation line and the third transistor for compensating.

Therein, the activating the organic light emitting diode, turning on the compensation module via the second scanning line, and turning off the switch module via the first scanning line to perform compensation detection on the organic light emitting diode, based on a determination that the compensation is required, outputting a compensation signal via a compensation terminal, and transmitting the compensation signal to the organic light emitting diode via the data compensation line and the compensation module for performing compensation after detection includes: outputting a high level signal via the first scanning line to turn on the first transistor and the second transistor to activate the organic light emitting diode; outputting a low level signal via the first scanning line to cut off the first transistor and the second transistor is cut off, outputting a high level signal via the second scanning line to turn on the third transistor; detecting a current of the organic light emitting diode via the data compensation line and the third transistor successively; when determining the compensation is required, outputting the compensation signal via the compensation terminal, and transmitting the compensation signal to the organic light emitting diode via the data compensation line and the third transistor for compensating.

Therein, before outputting a low level signal via the first scanning line to cut off the first transistor and the second transistor, and outputting a high level signal via the second scanning line to turn on the third transistor; transmitting the data signal outputted via the data terminal to the organic light emitting diode via the data compensation line and the third transistor for activating the organic light emitting diode, the method further includes: outputting a high level signal via the first scanning line to turn on the first transistor, outputting the low level signal via the data terminal and transmitting the low level signal to the second transistor via the data compensation line and the first transistor to cut off the second transistor.

Embodiments of the present disclosure disclose a pixel circuit group, applied to an organic light emitting display device, therein, the pixel circuit group includes a plurality of rows of pixel circuits; each row of the pixel circuit includes a switch module, a driving module, a compensation module, an organic light emitting diode, a first scanning line, a second scanning line, and a data compensation line; therein the first scanning line is coupled to the switch module, therein the switch module is further coupled to the driving module, therein the switch module is further coupled to the data compensation line, therein the driving module receives a DC voltage and is coupled to the organic light emitting diode, therein the second scanning line is coupled to the compensation module, and the compensation module is further coupled to the driving module and the organic light emitting diode; each of the plurality of rows of pixel circuits shares an identical data compensation line, and the data compensation line is coupled to the data terminal, the compensation terminal, and the detection terminal of a driving chip; during a display phase, the first scanning line is configured to turn on the switch module to activate the driving module, the second scanning line is configured to turn off the compensation module to enable a data terminal to output a data signal which is transmitted to the organic light emitting diode via the data compensation line, the switch module and the driving module; during a compensation phase after detection, the organic light emitting diode being activated, the second scanning line being configured to turn on the compensation module, and the first scanning line being configured to turn off the switch module, thus to perform compensation detection on the organic light emitting diode; based on a determination that the compensation is required, the compensation terminal outputs the compensation signal, and transmits the compensation signal to the organic light emitting diode via the data compensation line and the compensation module; therein, the plurality of rows of pixel circuits are displayed and compensated row by row.

Therein, the switch module is a first transistor, therein the driving module is a second transistor, and the compensation module is a third transistor; therein the first scanning line is coupled to a gate of the first transistor, therein a drain of the first transistor is coupled to the data compensation line, and the source of the first transistor is coupled to a gate of the second transistor; therein a drain of the second transistor is coupled to a voltage terminal of the driving chip and is configured for receiving the DC voltage, therein a source of the second transistor is coupled to an anode of the organic light emitting diode, and a cathode of the organic light emitting diode is grounded; the second scanning line is coupled to a gate of the third transistor, therein a drain of the third transistor is coupled to the data compensation line, and a source of the third transistor is coupled to an anode of the organic light emitting diode.

Therein, during the display phase, the first scanning line is configured to output a high level signal and the second scanning line is configured to output a low level signal, thus to cut off the third transistor and turn on the first transistor and the second transistor; the data signal outputted by the data terminal is transmitted to the organic light emitting diode via the data compensation line, the switch module and the driving module.

Therein, during the compensation phase after detection, the first scanning line is configured to output a high level signal to turn on the first transistor and the second transistor is turned on to activate the organic light emitting diode; the first scanning line is further configured to output a low level signal to cut off the first transistor and the second transistor is turned off, therein the second scanning line is configured to output a high level signal to turn on the third transistor to enable a current of the organic light emitting diode transmitted to the compensation terminal via the third transistor and the data compensation line successively for detecting; when determining the compensation is required, compensation terminal is configured to outputs the compensation signal and transmits the compensation signal to the organic light emitting diode via the third transistor for compensating.

Therein, during the compensation phase after detection, the first scanning line is configured to output a low level signal to cut off the first transistor and the second transistor, the second scanning line is configured to output a high level signal to turn on the third transistor; the data terminal is configured to output the data signal and transmit the data signal to the organic light emitting diode via the data compensation line and the third transistor for activating the organic light emitting diode; the compensation terminal is configured to detect a current of the organic light emitting diode via the data compensation line and the third transistor; when determining the compensation is required, the compensation terminal is further configured to output the compensation signal and transmit the compensation signal to the organic light emitting diode via the data compensation line and the third transistor.

Therein, the first scanning line is further configured to output a high level signal to turn on the first transistor before output the low level signal, the data terminal outputs the low level signal and transmits the low level signal to the second transistor via the data compensation line and the first transistor to cut off the second transistor.

Embodiments of the present disclosure disclose an organic light emitting display device, including a driving chip and a pixel circuit group coupled to the driving chip.

Embodiments of the present disclosure disclose a pixel circuit driving method, including: providing a plurality of rows of pixel circuits, therein, each row of the pixel circuit includes a switch module, a driving module, a compensation module, an organic light emitting diode, a first scanning line, a second scanning line, and a data compensation line, therein the first scanning line is coupled to the switch module, therein the switch module is further coupled to the driving module, therein the switch module is further coupled to the data compensation line, therein the driving module receives a DC voltage and is coupled to the organic light emitting diode, therein the second scanning line is coupled to the compensation module, and the compensation module is further coupled to the driving module and the organic light emitting diode; each of the plurality of rows of pixel circuits shares an identical data compensation line, and the data compensation line is coupled to the data terminal, the compensation terminal, and the detection terminal of a driving chip; turning on the switch module via the first scanning line to activate the driving module while turning off the compensation module via the second scanning line to enable a data terminal to output a data signal, and transmitting the data signal to the organic light emitting diode via the data compensation line, the switch module and the driving module for display; activating the organic light emitting diode, turning on the compensation module via the second scanning line, and turning off the switch module via the first scanning line to perform compensation detection on the organic light emitting diode, when determining compensation is required for driving, outputting a compensation signal via a compensation terminal, and transmitting the compensation signal to the organic light emitting diode via the data compensation line and the compensation module for performing compensation after detection; therein, the plurality of rows of pixel circuits are displayed and compensated row by row. When the organic light emitting diode is charged for display or compensated, the data compensation line is shared by the pixel circuit rather than performing corresponding functions by different lines. Therefore, the pixel circuit reduces the number of lines used in the pixel circuit and greatly improves the pixel effective display aperture ratio and resolution.

BRIEF DESCRIPTION OF THE ACCOMPANYING DRAWINGS

To describe technology solutions in the embodiments of the present disclosure more clearly, the following briefly introduces the accompanying drawings required for describing the embodiments. Obviously, the accompanying drawings in the following description show merely some embodiments of the present disclosure, those of ordinary skill in the art may also derive other obvious variations according to these accompanying drawings without creative efforts.

DETAILED DESCRIPTION OF ILLUSTRATED EMBODIMENTS

The technical solution in the embodiments of the present disclosure will be described clearly and completely hereinafter with reference to the accompanying drawings in the embodiments of the present disclosure. Obviously, the described embodiments are merely some but not all the embodiments of the present disclosure. All other embodiments obtained by a person of ordinary skill in the art according to the embodiments of the present disclosure without creative efforts shall all fall within the protection scope of the present disclosure.

In addition, the description of the following embodiments referring to accompanying drawings is provided to illustrate the specific embodiments in which the disclosure may be practiced. The directional terms mentioned in the present disclosure, such as "up", "down", "front", "back", "left", "right", "inside", "outside", "side" etc., only refer to the direction of the accompanying drawings. Therefore, the directional terminology is used to describe and understand the disclosure better and more clearly, rather than indicate or imply that the device or component must have a specific orientation, be constructed and operated in a specific orientation, therefore, it cannot be understood as a limitation of the present disclosure.

In the description of the present disclosure, it should be noted that, unless otherwise expressly stated and limited, the terms "installation", "coupled", and "connected" shall be understood broadly, for example, it can be a fixed connection, or it can be detachably connected, or integrally connected; it can be a mechanical connection; it can be directly connected, or indirectly connected through an intermediary, and it can be the internal connection of two components. For those skilled in the art, the specific meanings of the above terms in the present disclosure can be understood in a specific case.

Further, in the description of the present disclosure, unless otherwise stated, the meaning of "multiple" is two or more. If the term "process" appears in the specification, it means not only an independent process, but also cannot be clearly distinguished from other processes, as long as the expected function of the process can be realized. In addition, the numerical range represented by "~" in the specification, it means that a range in which the numerical values described before and after "~" are respectively included as a minimum value and a maximum value. In accompanying drawings, similar or identical structures are marked with the same symbol.

Figure 1:
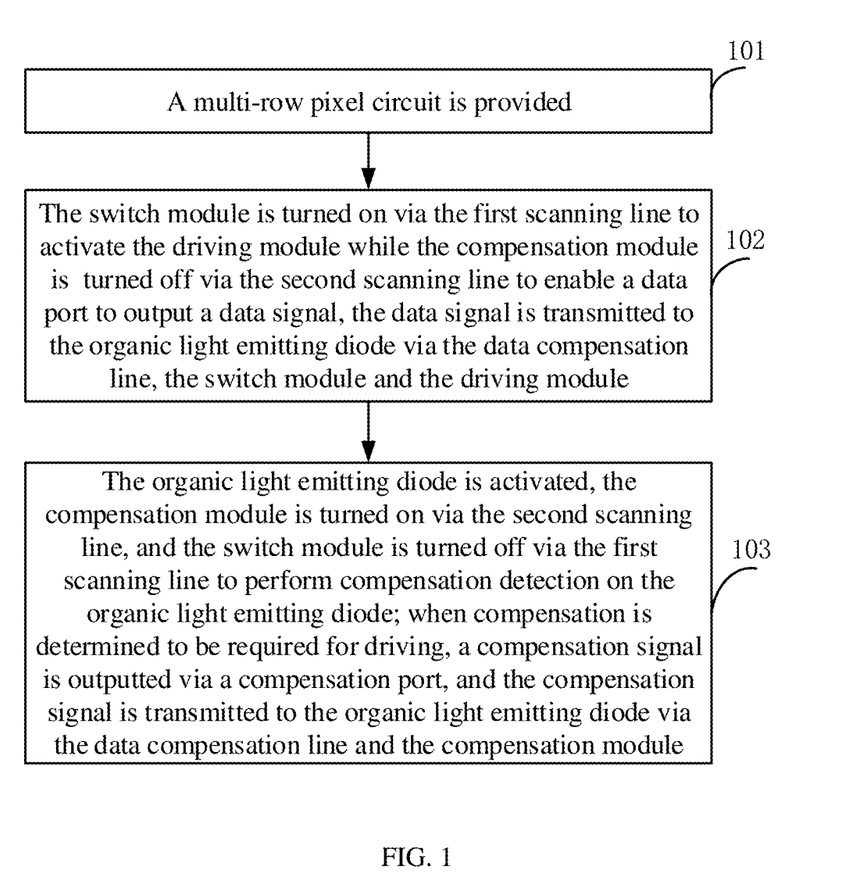
FIG. 1 is a flowchart of a pixel circuit driving method according to a first embodiment of a first aspect of the present disclosure.
Figure 2:
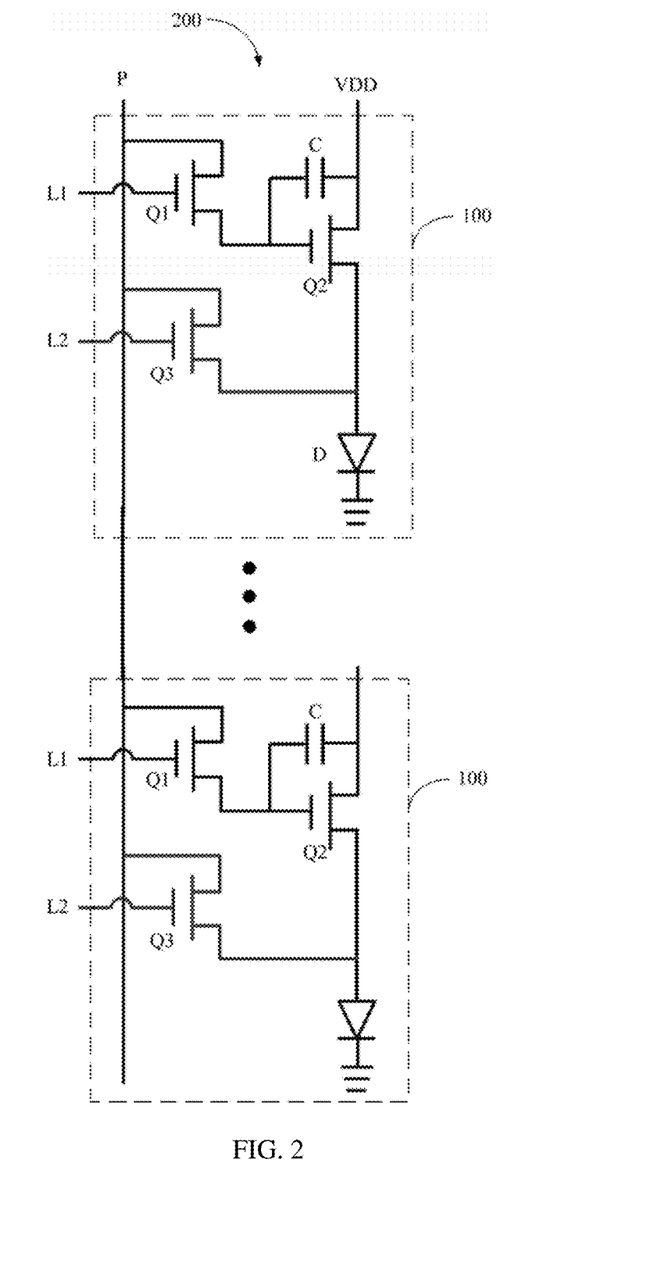
FIG. 2 is a circuit diagram of a pixel circuit group according to an embodiment of second aspect of the present disclosure.

Referring to FIG. 1 and FIG. 2, a first embodiment of the first aspect of the present disclosure provides a pixel circuit driving method. The pixel circuit driving method includes the following steps.

At block 101, a plurality of rows of pixel circuits are provided. Therein, each row of the pixel circuit 100 includes a switch module Q1, a driving module Q2, a compensation module Q3, an organic light emitting diode D, a first scanning line L1, a second scanning line L2, and a data compensation line P. The first scanning line L1 is coupled to the switch module Q1. The switch module Q1 is further coupled to the driving module Q2. The switch module Q1 is further coupled to the data compensation line P. The driving module Q2 receives a DC voltage and is coupled to the organic light emitting diode D. The second scanning line L2 is coupled to the compensation module Q3, and the compensation module Q3 is further coupled to the driving module Q2 and the organic light emitting diode D. The data compensation lines P of the plurality of rows of pixel circuits are the same one, and the data compensation line P is coupled to the data terminal, the compensation terminal, and the detection terminal.

It should be noted that the driving module Q2 can be connected with a voltage terminal of a driving chip to receive the DC voltage.

At block 102, the switch module Q1 is turned on via the first scanning line L1 to activate the driving module Q2 while the compensation module Q3 is turned off via the second scanning line L2, thus to enable the data terminal to output a data signal and transmit the data signal to the organic light emitting diode D via the data compensation line P, the switch module Q1 and the driving module Q2 for display.

Therein, at this time, the organic light emitting diode D is in a display stage.

At block 103, the organic light emitting diode D being activated, the compensation module Q3 being turned on via the second scanning line L2, and the switch module Q1 being turned off via the first scanning line, thus performing compensation detection for the organic light emitting diode D. Based on a determination that the compensation is required, a compensation signal is outputted via the compensation terminal, and the compensation signal is transmitted to the organic light emitting diode D via the data compensation line P and the compensation module Q3 for performing compensation after detection. Therein, the plurality of rows of pixel circuits are displayed and compensated row by row.

It should be noted that, the plurality of rows of pixel circuits being displayed and compensated row by row means that only after a current row of the pixel circuits is charged for display and compensated may the next row of the pixel circuits be charged for display and compensated.

In the embodiment, in the pixel circuit 100, when the organic light emitting diode D is charged for display or compensated, the data compensation line P is shared by the pixel circuit 100 rather than performing corresponding functions by different lines. Therefore, the pixel circuit 100 reduces the number of lines used in the pixel circuit 100 and greatly improves the pixel effective display aperture ratio and resolution.

Specifically, the switch module Q1 is a first transistor. The driving module Q2 is a second transistor. The compensation module Q3 is a third transistor. The first scanning line L1 is coupled to a gate of the first transistor, therein a drain of the first transistor is coupled to the data compensation line P, and a source of the first transistor is coupled to a gate of the second transistor; therein a drain of the second transistor is coupled to a voltage terminal of the driving chip and is configured for receiving the DC voltage from the voltage terminal of the driving chip, therein a source of the second transistor is coupled to an anode of the organic light emitting diode D, and a cathode of the organic light emitting diode D is grounded; therein the second scanning line L2 is coupled to a gate of the third transistor, therein a drain of the third transistor is coupled to the data compensation line P, and a source of the third transistor is coupled to an anode of the organic light emitting diode D.

Further, the block 102 includes the following blocks.

A high level signal is outputted via the first scanning line L1 and a low level signal is outputted via the second scanning line L2, thus to cut off the third transistor and turn on the first transistor and the second transistor. The data signal outputted by the data terminal is transmitted to the organic light emitting diode D via the data compensation line P, the switch module Q1 and the driving module Q2 for display.

Referring to FIG. 3 again, further, the block 103 includes the following blocks.

Figure 3:
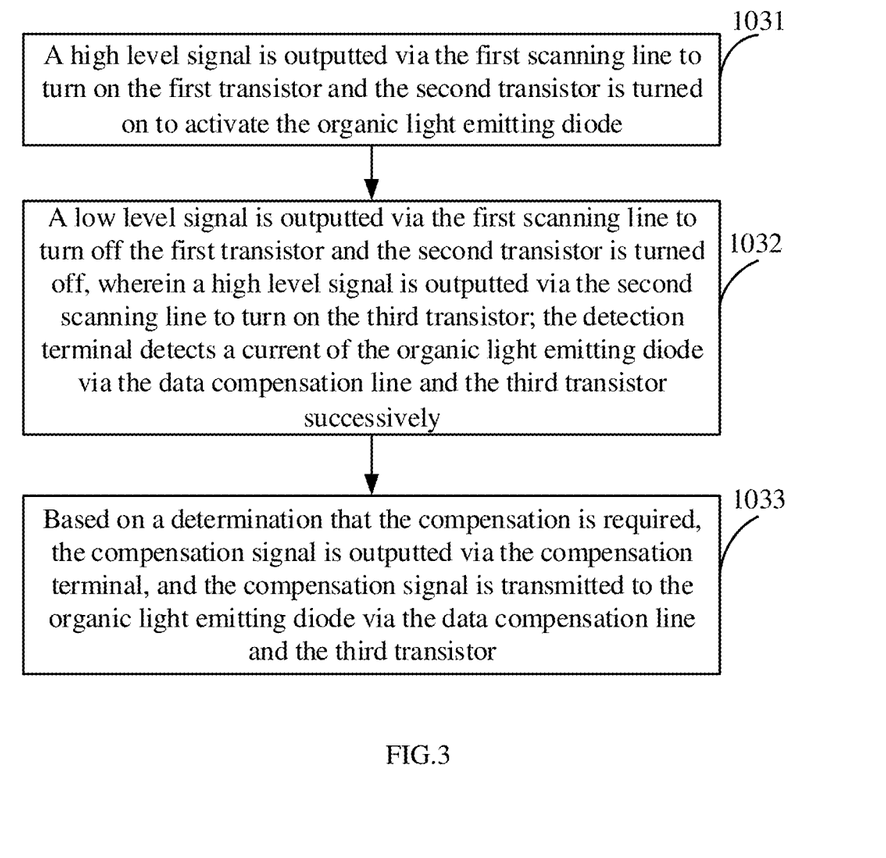
FIG. 3 is a flow chart of step 103 in FIG. 1.

At block 1031, a high level signal is outputted via the first scanning line L1 to turn on the first transistor and the second transistor to activate the organic light emitting diode D.

It should be noted that the organic light emitting diode D is activated through the second transistor in this block.

At block 1032, a low level signal is outputted via the first scanning line L1 to cut off the first transistor and the second transistor is cut off, therein a high level signal is outputted via the second scanning line L2 to turn on the third transistor. The detection terminal detects a current of the organic light emitting diode D via the data compensation line P and the third transistor successively.

At block 1033, when the compensation is determined to be required, the compensation terminal outputs the compensation signal, and transmits the compensation signal to the organic light emitting diode D via the data compensation line P and the third transistor for compensating.

It should be noted that the driving chip can determine the current offset of the organic light emitting diode D activated by the second transistor according to the current of the organic light emitting diode D received through the detection terminal, and control the compensation terminal output the compensation signal. The compensation signal is transmitted to the organic light emitting diode D via the data compensation line P to adjust the current of the organic light emitting diode D to a preset current to achieve compensation.

In the embodiment, the first to third transistors are thin film transistors.

Figure 4:
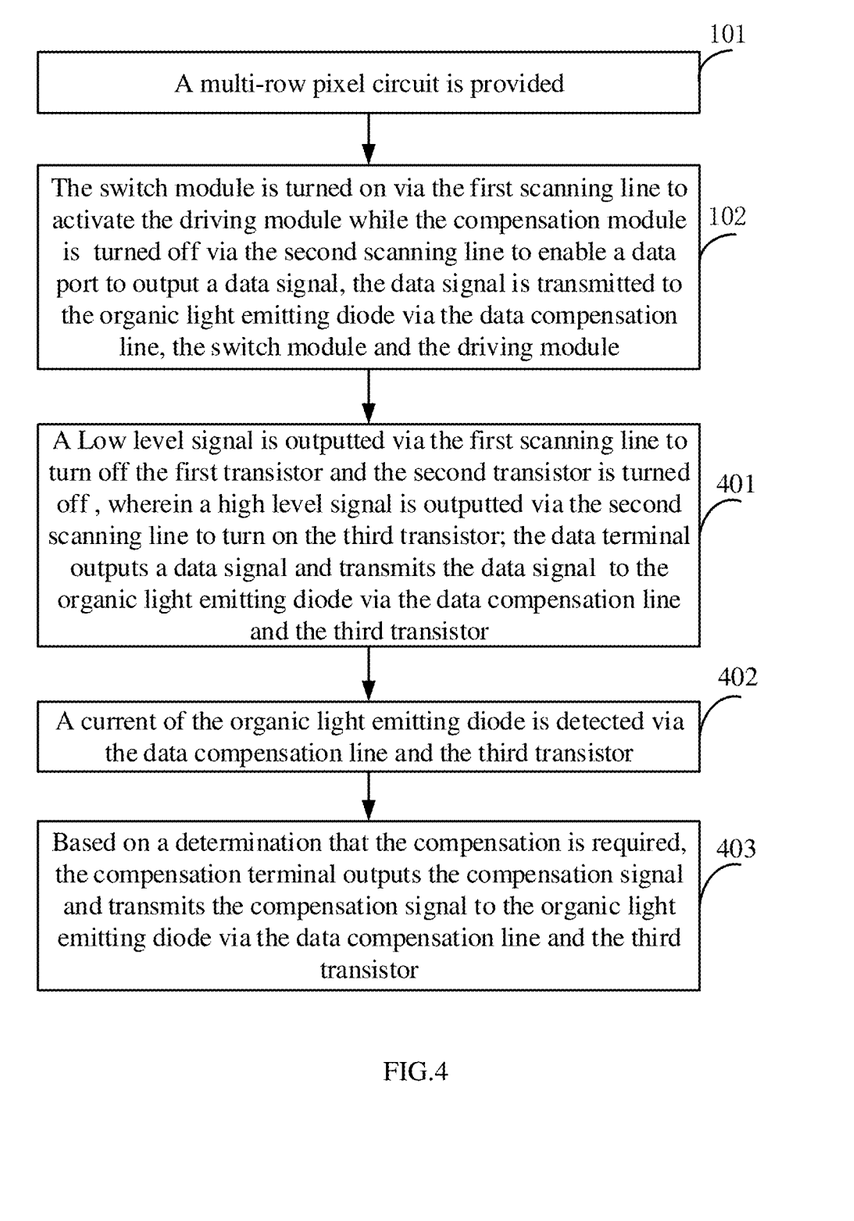
FIG. 4 is a flowchart of a pixel circuit driving method according to a second embodiment of the first aspect of the present disclosure.

Referring to FIG. 4, a second embodiment of the present disclosure provides a pixel circuit driving method. The pixel circuit driving method provided by the second embodiment is similar to the pixel circuit driving method provided by the first embodiment (that is, blocks 101-102 are the same). The differences are as follows: the block of "the organic light emitting diode D being activated, the compensation module Q3 being turned on via the second scanning line L2, and the switch module Q1 being cut off via the first scanning line L1, thus to perform compensation detection on the organic light emitting diode D. Based on a determination that the compensation is required, the compensation signal is outputted via a compensation terminal, and transmitted to the organic light emitting diode D via the data compensation line P and the compensation module Q3 for performing compensation after detection" includes the following blocks.

At block 401, a low level signal is outputted via the first scanning line L1 to cut off the first transistor and the second transistor; a high level signal is outputted via the second scanning line L2 to turn on the third transistor; the data terminal outputs the data signal, and transmits the data signal to the organic light emitting diode D via the data compensation line P and the third transistor to activate the organic light emitting diode D.

At block 402, the current of the organic light emitting diode D is detected via the data compensation line P and the third transistor.

At block 403, when the compensation is determined to be required, the compensation terminal outputs the compensation signal, and transmits the compensation signal to the organic light emitting diode D via the data compensation line P and the third transistor.

It should be noted that the driving chip can determine the current offset of the organic light emitting diode D activated by the second transistor according to the current of the organic light emitting diode D received through the detection terminal, and control the compensation terminal output the compensation signal. The compensation signal is transmitted to the organic light emitting diode D via the data compensation line P to adjust the current of the organic light emitting diode D to a preset current to achieve compensation.

Further, the following block can also be included before the block 401.

The high level signal is outputted via the first scanning line to turn on the first transistor. The data terminal outputs the low level signal and transmits the low level signal to the second transistor via the data compensation line and the first transistor to cut off the second transistor.

It should be noted that, in this block, since the organic light emitting diode D is activated by the third transistor, it is necessary to cut off the second transistor before performing the detection compensation to avoid the influence of the second transistor.

It should be noted that, the pixel circuit driving method provided by the present disclosure is also applicable to a liquid crystal display device.

Referring to FIG. 2 again, a first embodiment of the second aspect of the present disclosure provides a pixel circuit group 200. The pixel circuit group 200 is applied to an organic light emitting display device. The pixel circuit group 200 includes a plurality of rows of pixel circuits 100 each row of the pixel circuit 100 includes a switch module 10, a driving module 20, a compensation module 30, an organic light emitting diode D, a first scanning line L1, a second scanning line L2, and a data compensation line P. The first scanning line L1 is coupled to the switch module Q1. The switch module Q1 is further coupled to the driving module Q2. The switch module Q1 is further coupled to the data compensation line P. The driving module Q2 receives a DC voltage and is coupled to the organic light emitting diode D. The second scanning line L2 is coupled to the compensation module Q3, and the compensation module Q3 is further coupled to the driving module Q2 and the organic light emitting diode D. The data compensation lines of a plurality of rows of pixel circuits are the same one, and the data compensation lines are coupled to the data terminal, the compensation terminal, and the detection terminal of a driving chip.

During the display phase, the first scanning line L1 is configured to turn on the switch module Q1 to activate the driving module D. The second scanning line L2 is configured to turn off the compensation module Q3 to enable a data terminal to output a data signal and transmits the data signal to the organic light emitting diode D via the data compensation line P, the switch module Q1 and the driving module Q2.

During the compensation phase after detection, the organic light emitting diode D being activated, the second scanning line L2 being configured to turn on the compensation module Q3, and the first scanning line L1 being configured to turn off the switch module Q1, thus to perform compensation detection on the organic light emitting diode D. Based on a determination that the compensation is required, the compensation terminal outputs the compensation signal, and transmits the compensation signal to the organic light emitting diode D via the data compensation line P and the compensation module Q3. Therein, a plurality of rows of pixel circuits are displayed and compensated row by row.

It should be noted that, the driving module Q2 can be connected with a voltage terminal of a driving chip to receive the DC voltage. The plurality of rows of pixel circuits being displayed and compensated row by row means that only after a current row of the pixel circuits is charged for display may a next row of the pixel circuits be charged for display and compensated.

In the embodiment, in the pixel circuit 100, when the organic light emitting diode D is charged for display or compensated, the data compensation line P is shared, rather than performing corresponding functions by different lines. Therefore, the pixel circuit 100 reduces the number of lines used in the pixel circuit 100 and greatly improves the pixel effective display aperture ratio and resolution.

Specifically, the switch module Q1 is a first transistor. The driving module Q2 is a second transistor. The compensation module Q3 is a third transistor. The first scanning line L1 is coupled to a gate of the first transistor, therein a drain of the first transistor is coupled to the data compensation line P, and the source of the first transistor is coupled to a gate of the second transistor; therein a drain of the second transistor is coupled to a voltage terminal of the driving chip and is configured for receiving the DC voltage, therein a source of the second transistor is coupled to an anode of the organic light emitting diode D, and a cathode of the organic light emitting diode D is grounded; therein the second scanning line L2 is coupled to a gate of the third transistor, therein a drain of the third transistor is coupled to the data compensation line P, and a source of the third transistor is coupled to an anode of the organic light emitting diode D.

Further, in the display phase, the first scanning line L1 is configured to output a high level signal to turn on the first transistor and the second transistor, therein the second scanning line L2 is configured to output a low level signal to cut off the third transistor. The data signal outputted by the data terminal is transmitted to the organic light emitting diode D via the data compensation line P, the switch module Q1 and the driving module Q2.

During the compensation phase after detection, the first scanning line L1 is configured to output a high level signal to turn on the first transistor and the second transistor is turned on to activate the organic light emitting diode D. The first scanning line L1 is further configured to output a low level signal to cut off the first transistor and the second transistor is cut off, therein the second scanning line L2 is configured to output a high level signal to turn on the third transistor to enable a current of the organic light emitting diode D transmitted to the compensation terminal via the third transistor and the data compensation line P successively for detecting. When the compensation is determined to be required, the compensation terminal is configured to outputs the compensation signal and transmits the compensation signal to the organic light emitting diode D via the third transistor for compensating.

It should be noted that, in the embodiment, the first scanning line L1 activate the organic light emitting diode D through the second transistor. The driving chip can determine the current offset of the organic light emitting diode D activated by the second transistor according to the current of the organic light emitting diode D received through the detection terminal, and control the compensation terminal output the compensation signal. The compensation signal is transmitted to the organic light emitting diode D via the data compensation line P to adjust the current of the organic light emitting diode D to a preset current to achieve compensation.

In another embodiment, the organic light emitting diode D can also be activated by the third transistor, that is, during the compensation phase after detection, the first scanning line L1 is configured to output a low level signal to cut off the first transistor and the second transistor, therein the second scanning line L2 is configured to output a high level signal to turn on the third transistor. The data terminal is configured to output the data signal and transmit the data signal to the organic light emitting diode D via the data compensation line P and the third transistor for activating the organic light emitting diode D. The compensation terminal is configured to detect a current of the organic light emitting diode D via the data compensation line P and the third transistor. When the compensation is determined to be required, the compensation terminal is further configured to output the compensation signal and transmit the compensation signal to the organic light emitting diode D via the data compensation line P and the third transistor.

Therein, the driving chip can determine the current offset of the organic light emitting diode D activated by the second transistor according to the current of the organic light emitting diode D received through the detection terminal, and control the compensation terminal output the compensation signal. The compensation signal is transmitted to the organic light emitting diode D via the data compensation line P to adjust the current of the organic light emitting diode D to a preset current to achieve compensation.

It should be noted that, since the organic light emitting diode D is activated by the third transistor, it is necessary to cut off the second transistor before performing the detection compensation to avoid the influence of the second transistor. Therefore, the first scan line L1 is further configured to output a high level signal to turn on the first transistor before output a low level signal, and the data terminal is further configured to output a low level signal which transmitted to the second transistor via the data compensation line P and the first transistor to cut off the second transistor.

It should be noted that, the pixel circuit group 200 can also be applied to a liquid crystal display device.

Figure 5:
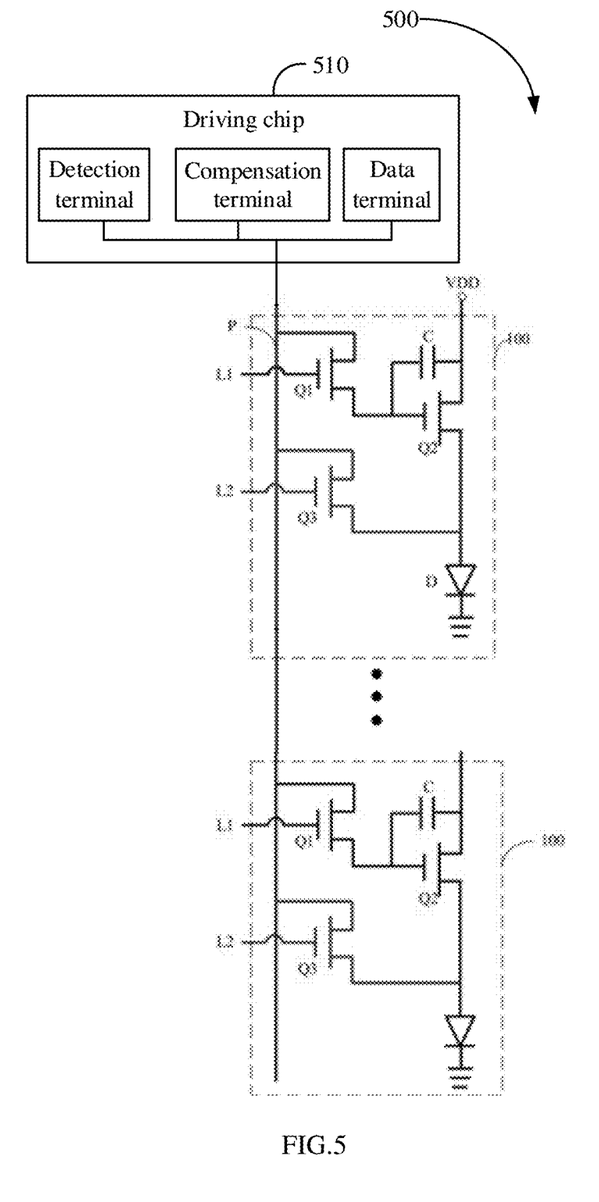
FIG. 5 is a circuit diagram of an organic light emitting display according to an embodiment of third aspect of the present disclosure.

Referring to FIG. 5, a third aspect of the present disclosure provides an organic light emitting display device 500. The organic light emitting display device includes a driving chip 510 and the above described pixel circuit group 200 connected with the driving chip 510. As the above pixel circuit group 200 has been described in detail in the above second embodiment, it will not be described herein.

In the embodiment, the organic light emitting display device 500 includes the pixel circuit 100. In the pixel circuit 100, when the organic light emitting diode D is charged for display or compensated, the data compensation line P is shared, rather than performing the corresponding functions by different lines. Therefore, the pixel circuit 100 reduces the number of lines used in the pixel circuit 100 and greatly improves the pixel effective display aperture ratio and resolution.

The above is a preferred embodiment of the present disclosure, and it should be noted that those skilled in the art may make some improvements and modifications without departing from the principle of the present disclosure, and these improvements and modifications are also the protection scope of the present disclosure.

What is claimed is:

1. A pixel circuit driving method, comprising:
providing a plurality of rows of pixel circuits, wherein, each of the rows of the pixel circuits comprises a switch module, a driving module, a compensation module, an organic light emitting diode, a first scanning line, a second scanning line, and a data compensation line, wherein the first scanning line is coupled to the switch module, wherein the switch module is further coupled to the driving module, wherein the switch module is further coupled to the data compensation line, wherein the driving module receives a DC voltage and is coupled to the organic light emitting diode, wherein the second scanning line is coupled to the compensation module, and the compensation module is further coupled to the driving module and the organic light emitting diode; each of the plurality of the rows of the pixel circuits shares an identical data compensation line, and the data compensation line is coupled to a data terminal, a compensation terminal, and a detection terminal of a driving chip;
turning on the switch module via the first scanning line to activate the driving module while turning off the compensation module via the second scanning line to enable the data terminal to output a data signal and transmit the data signal to the organic light emitting diode via the data compensation line, the switch module activates and the driving module for performing a display;
activating the organic light emitting diode, turning on the compensation module via the second scanning line, and turning off the switch module via the first scanning line, thus performing compensation detection on the organic light emitting diode; when determining compensation is required for driving, outputting a compensation signal via the compensation terminal, and transmitting the compensation signal to the organic light emitting diode via the data compensation line and the compensation module for performing compensation after detection; wherein, the plurality of the rows of the pixel circuits comprising the organic light emitting diode provide the display and the plurality of the rows of the pixel circuits are compensated row by row;
wherein, the switch module is a first transistor, wherein the driving module is a second transistor, and the compensation module is a third transistor; the first scanning line is coupled to a gate of the first transistor, wherein a drain of the first transistor is coupled to the data compensation line, and a source of the first transistor is coupled to a gate of the second transistor; a drain of the second transistor is coupled to a voltage terminal of the driving chip and is configured for receiving the DC voltage, wherein a source of the second transistor is coupled to an anode of the organic light emitting diode, and a cathode of the organic light emitting diode is grounded; the second scanning line is coupled to a gate of the third transistor, wherein a drain of the third transistor is coupled to the data compensation line, and a source of the third transistor is coupled to an anode of the organic light emitting diode;
wherein, turning on the switch module via the first scanning line to activate the driving module while turning off the compensation module via the second scanning line to enable the data terminal to output the data signal, and transmit the data signal to the organic light emitting diode via the data compensation line, the switch module activates the driving module for performing the display comprises:

outputting a high level signal via the first scanning line and outputting a low level signal via the second scanning line, thus to cut off the third transistor and turn on the first transistor and the second transistor;

transmitting the data signal outputted by the data terminal to the organic light emitting diode via the data compensation line, the switch module actives the driving module for performing the display.

2. The pixel circuit driving method according to claim 1, wherein the activating the organic light emitting diode, turning on the compensation module via the second scanning line, and turning off the switch module via the first scanning line, thus performing compensation detection on the organic light emitting diode; when determining compensation is required for driving, outputting the compensation signal via the compensation terminal, and transmitting the compensation signal to the organic light emitting diode via the data compensation line and the compensation module for performing compensation after detection comprises:

outputting a high level signal via the first scanning line to turn on the first transistor and the second transistor to activate the organic light emitting diode;

outputting a low level signal via the first scanning line to cut off the first transistor and the second transistor is cut off, and outputting a high level signal via the second scanning line to turn on the third transistor; detecting a current of the organic light emitting diode via the data compensation line and the third transistor successively;

when determining the compensation is required, outputting the compensation signal via the compensation terminal, and transmit the compensation signal to the organic light emitting diode via the data compensation line and the third transistor for compensating.

3. The pixel circuit driving method according to claim 1, wherein, activating the organic light emitting diode, turning on the compensation module via the second scanning line, and turning off the switch module via the first scanning line to perform compensation detection on the organic light emitting diode; when determining compensation is required for driving, outputting the compensation signal via the compensation terminal, and transmit the compensation signal to the organic light emitting diode via the data compensation line and the compensation module for performing compensation after detection comprises:

outputting a low level signal via the first scanning line to cut off the first transistor and the second transistor, outputting a high level signal via the second scanning line to turn on the third transistor; transmitting the data signal outputted via the data terminal to the organic light emitting diode via the data compensation line and the third transistor for activating the organic light emitting diode;

detecting a current of the organic light emitting diode via the data compensation line and the third transistor;

when determining the compensation is required, transmitting the compensation signal outputted via the compensation terminal to the organic light emitting diode via the data compensation line and the third transistor.

4. The pixel circuit driving method according to claim 3, wherein, before outputting a low level signal via the first scanning line to cut off the first transistor and the second transistor, and outputting a high level signal via the second scanning line to turn on the third transistor; transmitting the data signal outputted via the data terminal to the organic light emitting diode via the data compensation line and the third transistor for activating the organic light emitting diode, the method further comprises:

outputting a high level signal via the first scanning line to turn on the first transistor, outputting the low level signal via the data terminal and transmitting the low level signal to the second transistor via the data compensation line and the first transistor to cut off the second transistor.

5. A pixel circuit group, applied to an organic light emitting display device, wherein, the pixel circuit group comprises a plurality of rows of pixel circuits; each of the rows of the pixel circuits comprises a switch module, a driving module, a compensation module, an organic light emitting diode, a first scanning line, a second scanning line, and a data compensation line; wherein the first scanning line is coupled to the switch module, wherein the switch module is further coupled to the driving module, wherein the switch module is further coupled to the data compensation line, wherein the driving module receives a DC voltage and is coupled to the organic light emitting diode, wherein the second scanning line is coupled to the compensation module, and the compensation module is further coupled to the driving module and the organic light emitting diode; each of the plurality of the rows of the pixel circuits shares an identical data compensation line, and the data compensation line is coupled to a data terminal, a compensation terminal, and a detection terminal of a driving chip;

during a display phase, the first scanning line is configured to turn on the switch module to activate the driving module, the second scanning line is configured to turn off the compensation module to enable the data terminal to output a data signal and transmit the data signal to the organic light emitting diode via the data compensation line, the switch module activates the driving module for performing a display;

during a compensation phase after a compensation detection phase, the organic light emitting diode being activated, the second scanning line being configured to turn on the compensation module, and the first scanning line being configured to turn off the switch module, thus performing compensation detection on the organic light emitting diode; based on a determination that the compensation is required, the compensation terminal outputs a compensation signal and transmits the compensation signal to the organic light emitting diode via the data compensation line and the compensation module; wherein, the plurality of the rows of the pixel circuits comprising the organic light emitting diode provide the display and the plurality of the rows of the pixel circuits are compensated row by row;

wherein, the switch module is a first transistor, wherein the driving module is a second transistor, and the compensation module is a third transistor, the first scanning line is coupled to a gate of the first transistor, wherein a drain of the first transistor is coupled to the data compensation line, and a source of the first transistor is coupled to a gate of the second transistor; a drain of the second transistor is coupled to a voltage terminal of the driving chip and is configured for receiving the DC voltage, wherein a source of the second transistor is coupled to an anode of the organic light emitting diode, and a cathode of the organic light emitting diode is grounded; the second scanning line is coupled to a gate of the third transistor, wherein a drain of the third transistor is coupled to the data compensation line, and a source of the third transistor is coupled to an anode of the organic light emitting diode;

wherein, during the display phase, the first scanning line is configured to output a high level signal and the second scanning line is configured to output a low level signal, thus to cut off the third transistor and turn on the first transistor and the second transistor; the data signal outputted by the data terminal is transmitted to the organic light emitting diode via the data compensation line, the switch module and the driving module.

6. The pixel circuit group according to claim 5, wherein, during the compensation phase after detection, the first scanning line is configured to output a high level signal to turn on the first transistor and the second transistor is turned on to activate the organic light emitting diode;

the first scanning line is further configured to output a low level signal to cut off the first transistor and the second transistor is cut off; the second scanning line is configured to output a high level signal to turn on the third transistor to enable a current of the organic light emitting diode transmitted to the compensation terminal via the third transistor and the data compensation line successively for detecting;

when determining the compensation is required, compensation terminal is configured to outputs the compensation signal and transmits the compensation signal to the organic light emitting diode via the third transistor for compensating.

7. The pixel circuit group according to claim 5, wherein, during the compensation phase after detection, the first scanning line is configured to output a low level signal to cut off the first transistor and the second transistor; the second scanning line is configured to output a high level signal to turn on the third transistor; the data terminal is configured to output the data signal and transmit the data signal to the organic light emitting diode via the data compensation line and the third transistor for activating the organic light emitting diode;

the compensation terminal is configured to detect the current of the organic light emitting diode via the data compensation line and the third transistor; when determining the compensation is required, the compensation terminal is further configured to output the compensation signal and transmit the compensation signal to the organic light emitting diode via the data compensation line and the third transistor.

8. The pixel circuit group according to claim 7, wherein, the first scanning line is further configured to output a high level signal to turn on the first transistor before output the low level signal; the data terminal outputs the low level signal and transmits the low level signal to the second transistor via the data compensation line and the first transistor to cut off the second transistor.

9. An organic light emitting display device, comprising a driving chip and a pixel circuit group coupled to the driving chip, wherein, the pixel circuit group comprises a plurality of rows of pixel circuits; each of the rows of the pixel circuits comprises a switch module, a driving module, a compensation module, an organic light emitting diode, a first scanning line, a second scanning line, and a data compensation line; wherein the first scanning line is coupled to the switch module, wherein the switch module is further coupled to the driving module, wherein the switch module is further coupled to the data compensation line, wherein the driving module receives a DC voltage and is coupled to the organic light emitting diode, wherein the second scanning line is coupled to the compensation module, and the compensation module is further coupled to the driving module and the organic light emitting diode; each of the plurality of the rows of the pixel circuits shares an identical data compensation line, and the data compensation line is coupled to a data terminal, a compensation terminal, and a detection terminal of the driving chip;

during a display phase, the first scanning line is configured to turn on the switch module to activate the driving module, the second scanning line is configured to turn off the compensation module to enable the data terminal to output a data signal and transmit the data signal to the organic light emitting diode via the data compensation line, the switch module and the driving module;

during a compensation phase after a compensation detection phrase, the organic light emitting diode being activated, the second scanning line being configured to turn on the compensation module, and the first scanning line being configured to turn off the switch module, thus performing compensation detection on the organic light emitting diode; based on a determination that the compensation is required, the compensation terminal outputs a compensation signal and transmits the compensation signal to the organic light emitting diode via the data compensation line and the compensation module; wherein, the plurality of the rows of the pixel circuits comprising the organic light emitting diode provided the display and the plurality of the rows of the pixel circuits are compensated row by row;

wherein, the switch module is a first transistor, wherein the driving module is a second transistor, and the compensation module is a third transistor; wherein the first scanning line is coupled to a gate of the first transistor, wherein a drain of the first transistor is coupled to the data compensation line, and a source of the first transistor is coupled to a gate of the second transistor; wherein a drain of the second transistor is coupled to a voltage terminal of the driving chip and is configured for receiving the DC voltage, wherein a source of the second transistor is coupled to an anode of the organic light emitting diode, and a cathode of the organic light emitting diode is grounded; the second scanning line is coupled to a gate of the third transistor, wherein a drain of the third transistor is coupled to the data compensation line, and a source of the third transistor is coupled to an anode of the organic light emitting diode;

wherein, during the display phase, the first scanning line is configured to output a high level signal and the second scanning line is configured to output a low level signal, thus to cut off the third transistor and turn on the first transistor and the second transistor; the data signal outputted by the data terminal is transmitted to the organic light emitting diode via the data compensation line, the switch module and the driving module.

10. The organic light emitting display device according to claim 9, wherein, during the compensation phase after detection, the first scanning line is configured to output a high level signal to turn on the first transistor and the second transistor is turned on to activate the organic light emitting diode;

the first scanning line is further configured to output a low level signal to cut off the first transistor and the second transistor is cut off; the second scanning line is configured to output a high level signal to turn on the third transistor to enable a current of the organic light emitting diode transmitted to the compensation terminal via the third transistor and the data compensation line successively for detecting;

when determining the compensation is required, compensation terminal is configured to outputs the compensation signal and transmits the compensation signal to the organic light emitting diode via the third transistor for compensating.

11. The organic light emitting display device according to claim 9, wherein, during the compensation phase after detection, the first scanning line is configured to output a low level signal to cut off the first transistor and the second transistor; the second scanning line is configured to output a high level signal to turn on the third transistor; the data terminal is configured to output the data signal and transmit the data signal to the organic light emitting diode via the data compensation line and the third transistor for activating the organic light emitting diode;

the compensation terminal is configured to detect the current of the organic light emitting diode via the data compensation line and the third transistor; when determining the compensation is required, the compensation terminal is further configured to output the compensation signal and transmit the compensation signal to the organic light emitting diode via the data compensation line and the third transistor.

12. The organic light emitting display device according to claim 11, wherein, the first scanning line is further configured to output a high level signal to turn on the first transistor before output the low level signal; the data terminal outputs the low level signal and transmits the low level signal to the second transistor via the data compensation line and the first transistor to cut off the second transistor.

\* \* \* \* \*